United States Patent
Mahdjoub et al.

(10) Patent No.: US 9,494,638 B2
(45) Date of Patent: Nov. 15, 2016

(54) DEVICE FOR CHECKING ELECTRONIC CARDS

(71) Applicant: LARISYS INDUSTRIES, Neuve Eglise (FR)

(72) Inventors: Morad Mahdjoub, Montbeliard (FR); Marjorie Charrier, Audincourt (FR); Celine Constant, Recouvrance (FR)

(73) Assignee: Larisys Industries, Neuve Eglise (FR)

( * ) Notice: Subject to any disclaimer, the term of this patent is extended or adjusted under 35 U.S.C. 154(b) by 64 days.

(21) Appl. No.: 14/362,579

(22) PCT Filed: Dec. 7, 2012

(86) PCT No.: PCT/FR2012/052842
§ 371 (c)(1),
(2) Date: Jun. 3, 2014

(87) PCT Pub. No.: WO2013/083933
PCT Pub. Date: Jun. 13, 2013

(65) Prior Publication Data
US 2014/0333338 A1 Nov. 13, 2014

(30) Foreign Application Priority Data
Dec. 7, 2011 (FR) .................... 11 61298

(51) Int. Cl.
*G01R 31/00* (2006.01)
*G01R 31/28* (2006.01)
(Continued)

(52) U.S. Cl.
CPC ............ *G01R 31/2806* (2013.01); *G01R 1/04* (2013.01); *G01R 31/2808* (2013.01); *G01R 1/07335* (2013.01)

(58) Field of Classification Search
CPC .......... G01R 1/07328; G01R 31/2635; G01N 2203/0016; G01N 27/041; H01L 21/6719; H01L 21/67213
USPC ...... 324/500, 750.03–762.01, 537, 324/755.1–756.03, 425, 437, 750.16, 324/750.26, 690, 696, 724
See application file for complete search history.

(56) References Cited

U.S. PATENT DOCUMENTS

| | | | |
|---|---|---|---|
| 5,150,041 A | | 9/1992 | Eastin |
| 5,444,387 A | * | 8/1995 | Van Loan ............ G01R 31/316 324/750.25 |

(Continued)

FOREIGN PATENT DOCUMENTS

| | | |
|---|---|---|
| EP | 0256368 A1 | 2/1988 |
| EP | 1995602 A1 | 11/2008 |

(Continued)

*Primary Examiner* — Melissa Koval
*Assistant Examiner* — Trung Nguyen
(74) *Attorney, Agent, or Firm* — Andrew W. Chu; Craft Chu PLLC

(57) ABSTRACT

The device for checking electronic cards includes a base in which conductive nails are arranged pointing upwards, and a cover, also fitted with nails pointing downwards in the closed cover position. The cover is mobile in horizontal translation between an open position and an intermediate position. The device can also include a vertical translation mechanism capable of bringing the nails arranged in the cover closer to the nails arranged in the base so as to allow contact of the nails on the two faces of an electronic card. The invention also relates to a method of opening and a method of closing such a device.

9 Claims, 1 Drawing Sheet

(51) Int. Cl.
  *G01R 1/04*   (2006.01)
  *G01R 1/073*  (2006.01)

(56) References Cited

U.S. PATENT DOCUMENTS

| | | | |
|---|---|---|---|
| 5,572,144 A | | 11/1996 | Davidson et al. |
| 5,635,775 A | * | 6/1997 | Colburn ............... H05K 1/0231 |
| | | | 307/91 |
| 5,894,225 A | * | 4/1999 | Coffin ................. G01R 31/2887 |
| | | | 324/754.15 |
| 6,900,648 B2 | * | 5/2005 | Ou ..................... G01R 31/2806 |
| | | | 324/750.25 |
| 7,400,135 B1 | | 7/2008 | Bartholomew |
| 2004/0178815 A1 | | 9/2004 | Ou et al. |
| 2007/0152694 A1 | | 7/2007 | Yin et al. |
| 2008/0054910 A1 | | 3/2008 | Lee et al. |
| 2008/0197868 A1 | | 8/2008 | Fossum et al. |

FOREIGN PATENT DOCUMENTS

| | | |
|---|---|---|
| FR | 2842607 A1 | 1/2004 |
| KR | 970002353 A | 1/1997 |

\* cited by examiner

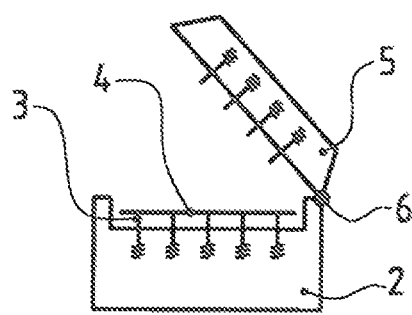
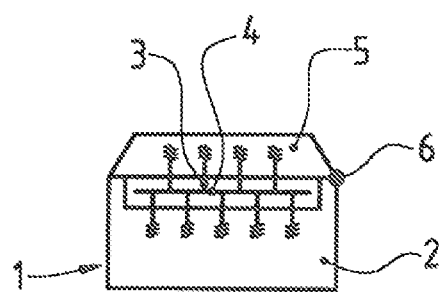
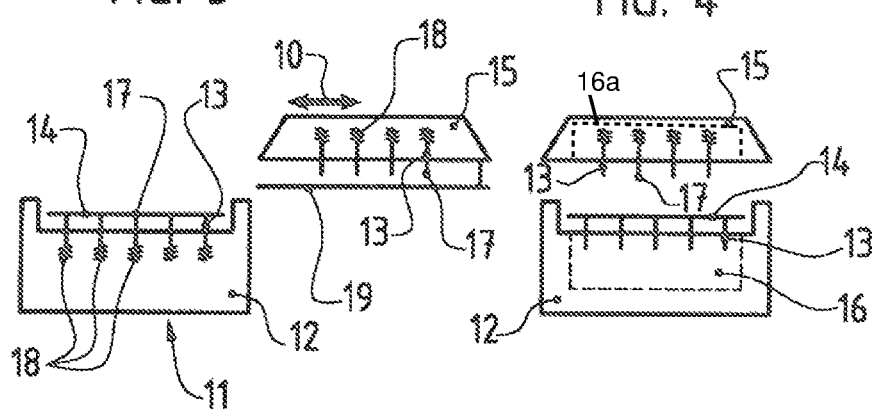
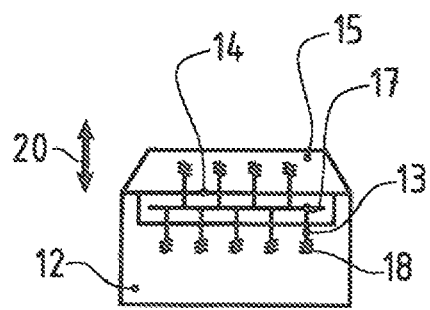
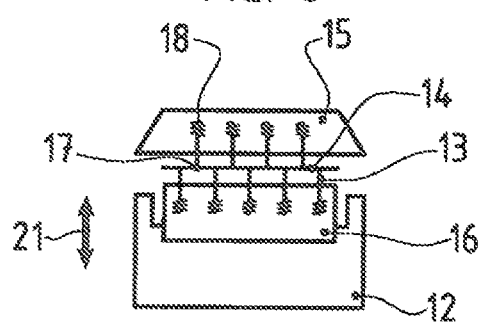

DEVICE FOR CHECKING ELECTRONIC CARDS

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

1. Field of the Invention

The invention relates to the field of checking of electronic cards.

It relates in particular to a test bench for electronic cards.

The manufacturing of electronic cards, or printed circuits, generally occurs from epoxy resin or fiberglass, on which is deposited on both sides a thin layer of copper coated with a photosensitive varnish. A plate-setter permits to "draw" the circuit, sensitizing the varnish at the selected locations. The sensitized varnish is then removed, which permits to chemically etch the copper at the same locations, and to thus obtain electrical circuits between various spots on the card. After removal of the varnish, the assembling of the components is then proceeded to.

It is then generally necessary to proceed to checking the operation of these cards. This requires checking the conformity of the current flow, the current values or the current barrier between various spots. These checking operations can of course be done manually, but require then a lot of time.

2. Description of Related Art Including Information Disclosed Under 37 CFR 1.97 and 37 CFR 1.98.

From the state of the art are known checking devices 1 including a base 2, in which are implanted needles 3, or conductive nails, pointing upwards. The card 4 to be checked is placed on the nails in an adequate manner, the nails each entering into contact with a spot of the electric circuit of the electronic card. The device comprises in addition a cover 5 movable in rotation about a hinge 6, and also provided with nails, pointing downwards. When closing the cover, the nails of the cover enter into contact with the top of the electronic card. The electronic card can then be tested in its whole by an electronic management of the contacts, or the voltage between the various nails, as well as a management of the measurements of the retroactions sent back by the electronic card.

However, the opening of the cover requires a movement of the cover in an extended area above the device. Because of the possible presence of operators in this area, the opening and closing movement should be slow, in order to limit at best the risk of accidents. Moreover, an automatic checking of the presence of hands throughout the area swept by the lid during its closing or opening is quite delicate. Furthermore, the movement of the cover is generally controlled by an actuator. This actuator can be close to the hinge, but then the force applied is important and requires a strong, and therefore expensive and cumbersome, cylinder or the cylinder is arranged farther away from the hinge, and the effort is lower but then the travel distance is larger, and the cylinder is still expensive and cumbersome. Furthermore, the rotational movement of the cover induces a horizontal component of the movement of the nails, even at the moment they enter into contact with the card, which is prejudicial to the reliability of the test, on the one hand, and produces effects of wear on the nails and/or the cards being tested.

SUMMARY OF THE INVENTION

The present invention pretends to cope with at least part of the above-mentioned drawbacks and provides a solution that permits to check electronic cards with a compact device, with which the safety is easier to be ensured.

To this end, the invention relates to a device for checking electronic cards comprising a base, in which conductive nails are arranged, pointing upwards, and a cover, also provided with nails, pointing downwards in closed position of the cover. The device is particular in that said cover is movable in horizontal translation between an open position and an intermediate position, and in that said device comprises a vertical translation means capable of bringing the nails arranged in the cover closer to the nails arranged in the base, so as to permit a contact of said nails on both faces of an electronic card.

The advantage of the present invention is that by eliminating the rotational movement of the cover, a smaller size, and a much smaller area of danger and easier to be checked and made safe is achieved. Furthermore, the accuracy of the positioning of the nails on the card is improved.

According to further features:

said means can be a means for vertical translation of the cover between said intermediate position and a closed position, thus permitting to simplify the design of the base, on the one hand, and the cover, on the other hand, by arranging the movements at the interface between the base and the cover, the base can include a base platelet, and said means can be a means for vertical translation of said platelet between a resting position and a working position, said nails arranged in the base being arranged on said base platelet; such an arrangement permits to clearly separate the movements and limit the cover to a horizontal movement, the cover can include a cover platelet, and said means can be a means for vertical translation of said platelet between a resting position and a working position, the nails of the cover being arranged on said cover platelet; such an arrangement permits to simplify the cover by limiting the parts in vertical movement, and the base by suppressing any movement in the base, said device can include a ratchet mechanism capable of ensuring a substantially horizontal translation of the cover; such an arrangement permits to achieve a simple and reliable mechanism for this movement, the device can comprise actuators capable of ensuring an upward or downward translation of the cover or the plate, respectively; such a solution is also simple to be implemented, and very reliable.

The present invention also relates to a method for closing a device according to the invention, in which an electronic card to be checked has been arranged, comprising the following steps:
- checking the absence of obstacles on the path of the cover;
- substantially horizontal translation of the cover; and
- substantially vertical translation bringing the nails of the cover closer to the base of the electronic card, so as to permit its checking.

Finally, the present invention relates to a method for opening a device according to the invention, after checking an electronic card, comprising the following steps:
- vertical separation of the nails of the cover and the base until the nails of the cover are no longer into contact with the electronic card,
- substantially horizontal translation of the cover to its open position.

The advantage of the present invention lies in particular in that the movement of the cover is a translation movement, which results into a lesser space requirement, facilitates the management of the safety of the operator, and improves the accuracy of the positioning. It also permits to work faster and increase the rhythms, and/or to simplify certain arrangements such as the springs of the nails.

Further features and advantages of the invention will become clear from the following detailed description, with reference to an exemplary embodiment given as an indication and in a non-restrictive way.

The understanding of this description will be made easier when referring to the attached drawings.

BRIEF DESCRIPTION OF THE DRAWINGS

FIG. 1 represents a side elevation view of a device according to the state of the art in open position.

FIG. 2 represents a side elevation view of a device according to the state of the art in closed position.

FIG. 3 represents a side elevation view of a device according to the invention in open position.

FIG. 4 represents a side elevation view of the device of FIG. 1 in an intermediate position.

FIG. 5 represents a side elevation view of the device of FIG. 1 in closed position.

FIG. 6 represents a side elevation view of another embodiment of a device according to the invention in closed position.

DETAILED DESCRIPTION OF THE DRAWINGS

As shown in FIGS. 3 to 6 of the attached drawing, the present invention relates to a device 11 for checking electronic cards 14. The device 11 includes a base 12 provided with nails or needles 13 arranged with the tips 17 upwards. The device 11 comprises in addition a cover 15, also provided with nails 13, but arranged with the tips 17 downwards. The nails 13 are mounted on the base 12 or the cover 15 through springs 18 the function of which is to exert a force for applying the tip 17 on the card 14 to be checked. Such an effort for the application is necessary to permit a good flow of electric current for checking between the nails 13 and the electrical circuit of the electronic card 14.

The cover 15 is movable in translation according to a substantially horizontal movement represented by an arrow 10 in FIG. 3, between an open position represented in FIG. 3 and an intermediate position represented in FIG. 4. This movement 10 can be performed thanks to a rack 19 represented schematically in FIG. 3. Of course, this is only one solution among all the solutions those skilled in the art could provide to perform such a substantially horizontal movement 10 of the cover 15.

According to one embodiment of the invention, the cover 15 is also movable in translation according to a substantially vertical motion 20 represented by an arrow in FIG. 5, between the intermediate position represented in FIG. 4 and a closed position represented in FIG. 5 This movement can be performed thanks to actuators, not shown, the effect of which is to raise or lower the cover 15 and the rack 19. Here too, this is only one solution among all the solutions that those skilled in the art could provide to perform such a substantially vertical movement 20 of the cover 15.

According to another embodiment of the invention, the cover 15 is maintained in its intermediate position, and the nails 13 of the base 12 are arranged on a base platelet 16, movable in translation according to a substantially vertical movement 21 represented by an arrow in FIG. 6, between a resting position represented in dashed lines in FIG. 4 and a working position represented in FIG. 6. Here too, the vertical movement 21 can be performed by actuators the function of which is to raise or lower the base platelet 16, or by any other means. The nails 13 of the cover 15 can also be arranged on a cover platelet 16a, which then lowers alone, without vertical movement 20 of the cover 15 itself. Such an arrangement permits to reduce the moving mass and the number of moving parts, and thus to reduce the energy consumption and the maintenance costs.

In the various embodiments, the vertical movement 20, 21 produces the nearing, then the contact between the tips 17 of the nails 13 of the cover 15 of the electronic card 14. The springs 18 ensure a force of application of the tips 17 on the card 14.

According to one advantageous embodiment of the invention, the springs 18 can be eliminated either in the base 12 (example shown in FIG. 4) or in the cover 15 (example not shown). Indeed, the movement of bringing the nails 13 of the cover 15 closer to the card 14 occurs in a perfectly aligned way, without any horizontal component of the movement, in contrast to the device 1 of the state of the art. This permits therefore a much more accurate approach, making possible a good contact of the tips 17 on the card 14 on both sides of the card 14, even when in only one among the base 12 and the cover 15 the nails 13 are provided with springs 18.

The use of the device 11 then occurs as follows:

By actuating an opening control, by means of a pushbutton located on the device 11, the cover 15 goes into the open position. The operator then places the electronic card 14 to be checked on the tips 17 of the nails 13 of the base 12. Marks or gauges can be provided in order to assist a proper positioning of the card 14. The operator then actuates a closing control, by means of another push-button. The device 11 comprises means for detecting an obstacle on the path of the cover 15, as well as between the cover 15 and the base 12 during the path. When these detecting means are activated, there is an obstacle. Such an obstacle can namely consist of a hand of the operator. It would then be dangerous for him to immediately close the cover 15. As soon as there is no longer any obstacle, the cover 15 quickly moves into the intermediate position. A sensor permits to confirm that this position has been reached, then, according to the embodiment, the cover 15 or its platelet is lowered, or the base platelet 16 is raised, until the contact between the tips 17 of the nails 13 of the cover 15 with the card 14 occurs. The device 11 performs the checking, then starts the opposite movements of lifting of the cover 15 or its platelet or of lowering the base platelet 16, then of horizontal translation into the open position of the cover 15. The electronic card 14 can then be removed, and if there is no other card 14 to be checked immediately after, the cover 15 can be closed.

Of course, other procedures or checking operations can be foreseen or added, according to a usual expertise of those skilled in the art, without departing from the scope of the present invention.

In the embodiment with a platelet 16 movable in vertical translation, the device 11 can be defined as in resting position when the cover 15 is in the intermediate position and the base platelet 16 in the lower position, or the platelet of the cover is in the upper position. The base 12 and the cover 15 can then be configured so that in these positions the cover 15 ensures a sufficiently effective closing of the device 11 when stopped. During an opening command, the translational movement of the cover 15 can start immediately, without requiring first a vertical translation movement, which permits to achieve that the device 11 is more quickly operative.

The advantage of the present invention lies in particular in that the movement of the cover 15 is a translational movement, which results into a lesser bulkiness, facilitates the management of the safety of the operator, and improves the accuracy of the positioning. This also permits to work faster and to increase the rhythms, and/or to simplify certain arrangements such as the springs 18 of the nails 13.

We claim:

1. A device for checking electronic cards comprising:
    a base having a first set of conductive nails arranged with tips facing upwards,
    a cover having a second set of conductive nails arranged with tips facing downwards in an opened cover position and in a closed cover position, and a horizontal translation means for said cover, wherein said cover is movable in horizontal translation between said opened cover position, an intermediate cover position and said closed cover position, said first set of conductive nails oriented to face said second set of conductive nails in all positions, and
    a cover vertical translation means for the said second set of conductive nails, said cover vertical translation means mounted to said cover, said second set of conductive nails being movable in vertical translation relative to said first set of conductive nails arranged in said base, the first set and the second set of nails contacting on respective faces of an electronic card so as to make electrical contact between said second set of nails in electrical contact with a respective face of said electronic card.

2. The device, according to claim 1, wherein said cover vertical translation means is movable between a cover resting position and a cover working position, when said cover moves between said intermediate cover position and said closed cover position by said horizontal translation means.

3. The device, according to claim 1, wherein said base is comprised of a base platelet and a base vertical translation means connected to said base platelet, said base vertical translation means having a resting base platelet position and a working base platelet position, said first set of conductive nails arranged in said base being arranged on said base platelet.

4. The device, according to claim 1, wherein said cover comprises a cover platelet, said cover platelet being movable between a resting cover platelet position and a working cover platelet position according to said cover vertical translation means, said second set of conductive nails of the cover being arranged on said cover platelet.

5. The device, according to claim 1, wherein said horizontal translation means is comprised of a ratchet mechanism being engaged to said cover.

6. The device, according to claim 4, wherein said cover vertical translation means of said second set of conductive nails comprises cover actuators, said cover actuators being connected to at least one of a group consisting of: said cover, and said cover platelet.

7. A method for testing an electronic card, said method comprising the following steps:
    assembling a device, according to claim 1;
    checking absence of obstacles on a path of said cover;
    translating said cover substantially horizontal from said open cover position to said intermediate cover position; and
    translating said second set of conductive nails of said cover substantially vertical closer to the electronic card while said cover is between said intermediate cover position and closed cover position, so as to permit checking said second set of conductive nails relative to the electronic card.

8. The method for testing, according to claim 7, said method comprising the following steps:
    checking said electronic card with said second set of conductive nails in electrical contact with the electronic card;
    separating vertically said second set of conductive nails from contact with the electronic card, while said cover is in said closed cover position; and
    translating the cover substantially horizontal from said closed cover position to said intermediate cover position and to said opened cover position, after said second set of conductive nails are separated from the electronic card.

9. The device, according to claim 3, wherein said base vertical translation means of said first set of conductive nails comprises base actuators, said base actuators being connected to at least one of a group consisting of: said base and said base platelet.

* * * * *